(12) United States Patent
Basceri et al.

(10) Patent No.: US 7,388,248 B2
(45) Date of Patent: Jun. 17, 2008

(54) DIELECTRIC RELAXATION MEMORY

(75) Inventors: Cem Basceri, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 10/930,774

(22) Filed: Sep. 1, 2004

(65) Prior Publication Data

US 2006/0043448 A1 Mar. 2, 2006

(51) Int. Cl.
*H01L 29/78* (2006.01)
*H02H 3/22* (2006.01)

(52) U.S. Cl. .......................... 257/312; 257/67; 257/68; 257/310; 361/111; 361/112

(58) Field of Classification Search ............... 257/296, 257/68–71, 297–309, 310, 312, E29.001, 257/905, 906, 907, 908, E21.646, 67; 361/111, 361/112
See application file for complete search history.

(56) References Cited

U.S. PATENT DOCUMENTS

| | | | |
|---|---|---|---|
| 2003/0072126 A1* | 4/2003 | Bhattacharyya | 361/311 |
| 2005/0063141 A1* | 3/2005 | Jeong et al. | 361/312 |
| 2005/0201141 A1* | 9/2005 | Turner | 365/149 |

OTHER PUBLICATIONS

H. Reisinger et al, "A comparative study of dielectric relaxation losses in alternative dielectrics", Infineon Technologies, 2001, IEEE.
J. R. Jameson et al., "Problems with Metal-Oxide High-$_k$ Dielectrics Due to 1/t Dielectric Relaxation Current in Amorphous Materials", Stanford University, 2003, IEEE.
M. Schumacher et al., "Curie—Von Schweidler Behaviour Observed in Ferroelectric Thin Films and Comparison to Superparaelectric Thin Film Materials", Integrated Ferroelectrics, 1998, pp. 109-121, vol. 22.
Cem Basceri et al., The dielectric response as a function of temperature and film thickness of fiber-textured (Ba, Sr) (TiO$_3$) thin films grown by chemical vapor deposition, J. Appl. Phys., Sep. 1, 1997, p. 2497, vol. 82(5).
Tsuyoshi Horikawa et al., "Dielectric Relaxation of (Ba, Sr) TiO$_3$ Thin Films", J. Appl. Phys. (1995) pp. 5478-5482., vol. 34, Part 1, No. 9B.
M. Schumacher et al., "Dielectric Relaxation of Perovskite-Type Oxide Thin Films", Integrated Ferroelectrics, 1995, vol. 34, pp. 231-245, vol. 10.

* cited by examiner

*Primary Examiner*—Long K. Tran
(74) *Attorney, Agent, or Firm*—Dickstein Shapiro LLP

(57) ABSTRACT

A capacitor structure having a dielectric layer disposed between two conductive electrodes, wherein the dielectric layer contains at least one charge trap site corresponding to a specific energy state. The energy states may be used to distinguish memory states for the capacitor structure, allowing the invention to be used as a memory device. A method of forming the trap cites involves an atomic layer deposition, of a material at pre-determined areas in the dielectric layer.

26 Claims, 8 Drawing Sheets

DIELECTRIC RELAXATION MEMORY

FIELD OF THE INVENTION

The present invention relates to the field of memory devices, and in particular to a memory device that utilizes dielectric relaxation.

BACKGROUND OF THE INVENTION

A memory cell in an integrated circuit, such as a dynamic random access memory (DRAM) array, typically comprises a charge storage capacitor (or cell capacitor) coupled to an access device such as a metal oxide semiconductor field effect transistor (MOSFET). The MOSFET functions to apply or remove charge on the capacitor, thus effecting a logical state defined by the stored charge. The amount of charge stored on the capacitor is proportional to the capacitance C, defined by $C=kk_0A/d$, where k is the dielectric constant of the capacitor dielectric, $k_0$ is the vacuum permittivity, A is the electrode surface area and d is the distance between electrodes.

FIG. 1 illustrates a portion of a conventional DRAM memory circuit containing two neighboring DRAM cells 10. For each cell, one side of the storage capacitor 14 is connected to a reference voltage Vr, which is typically one half of the internal operating voltage (the voltage typically corresponding to a logical "1" value) of the circuit. The other side of the storage capacitor 14 is connected to the drain of an access field effect transistor 12. The gate of the access field effect transistor 12 is connected to a word line 18. The source of the field effect transistor 12 is connected to a bit line 16. With the cell 10 connected in this manner, it is apparent that the word line 18 controls access to the storage capacitor 14 by allowing or preventing a signal (corresponding to a logic "0" or a logic "1") on the bit line 16 to be written to or read from the storage capacitor 14 only when a signal from the word line 18 is applied to a gate of the access transistor 12.

Capacitors, like the capacitors 14 shown in FIG. 1, suffer from current loss in two ways: (1) direct current leakage loss, which results in high power consumption, and (2) dielectric relaxation. Direct current leakage loss accounts for charge transport from one electrode to another across the dielectric. Direct current leakage also creates the need for a DRAM cell to be refreshed at frequent periods, as charge stored in the capacitor leaks to adjacent active areas on the memory cell. Dielectric relaxation, on the other hand, is a phenomenon that refers to a residual polarization within a dielectric material of a memory storage device when a voltage is applied to the device. Dielectric relaxation, which can be described mathematically in accordance with the Curie-von Schweidler behavior formula, is time-dependent. At least in ideal operation, however, dielectric relaxation is independent of the electrode material, dielectric thickness, and any direct leakage current from the dielectric layer. More significantly, dielectric relaxation is dependent on the type of dielectric materials used and becomes increasingly worse for high-k dielectric materials, which for other reasons are increasingly favored in integrated circuit fabrication.

FIG. 2A is an illustrative graph of current stored in a capacitor versus time for a capacitor 14 (FIG. 1). As shown in FIG. 2A, a capacitor that suffers only from direct current leakage, has a nearly horizontal slope (line 5) on this graph, meaning that the direct current loss is not dependent on time. As shown by line 1, however, when dielectric relaxation losses are realized, the slope of the line 1 changes significantly, and thus, the current loss from dielectric relaxation is dependent on time. Each of the dotted sloped lines 2-4 show possible relaxation leakage from a capacitor, which may change based on other factors such as the temperature and the applied voltage.

The current losses from dielectric relaxation are undesirable for many reasons. In DRAM devices, for example, dielectric relaxation can affect the effectiveness of some dielectrics, such as high-k dielectrics, used in the DRAM storage capacitors. In addition, dielectric relaxation can create a threshold shift that severely deteriorates MOSFET performance.

There is a need, therefore, for a memory cell capacitor structure that does not suffer from the undesirable effects of dielectric relaxation but rather can use this phenomenon in a beneficial manner. Accordingly, there is also needed a simple method of producing and operating the desired capacitor structure.

BRIEF SUMMARY OF THE INVENTION

The present invention provides a capacitor structure having a dielectric layer disposed between two conductive electrodes, wherein the dielectric layer contains at least one charge trap site corresponding to a specific energy state. Energy states may be used to distinguish logical states for the capacitor structure, allowing the invention to be used as a memory device. A method of forming the trap sites involves an atomic layer deposition of a material at predetermined areas in the capacitor's dielectric layer.

In accordance with an exemplary method of operating the capacitor structure as a memory device, a write voltage is pulsed across the electrodes to fill some or all of the trap sites. The device may be subsequently read using a read voltage applied at the electrodes which senses the filled trap sites as a logical value. In addition, the refresh time may be tuned as desired by adjusting the density and energy state of the trap centers based on the selection of materials.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following description, reference is made to the accompanying drawings which will serve to illustrate the preferred embodiments of the invention. These embodiments provide sufficient detail to enable those skilled in the art to practice the invention. Of course other embodiments may be used and various changes may be made without departing from the scope of the present invention. The scope of this invention is defined by the appended claims.

Figure 2A:
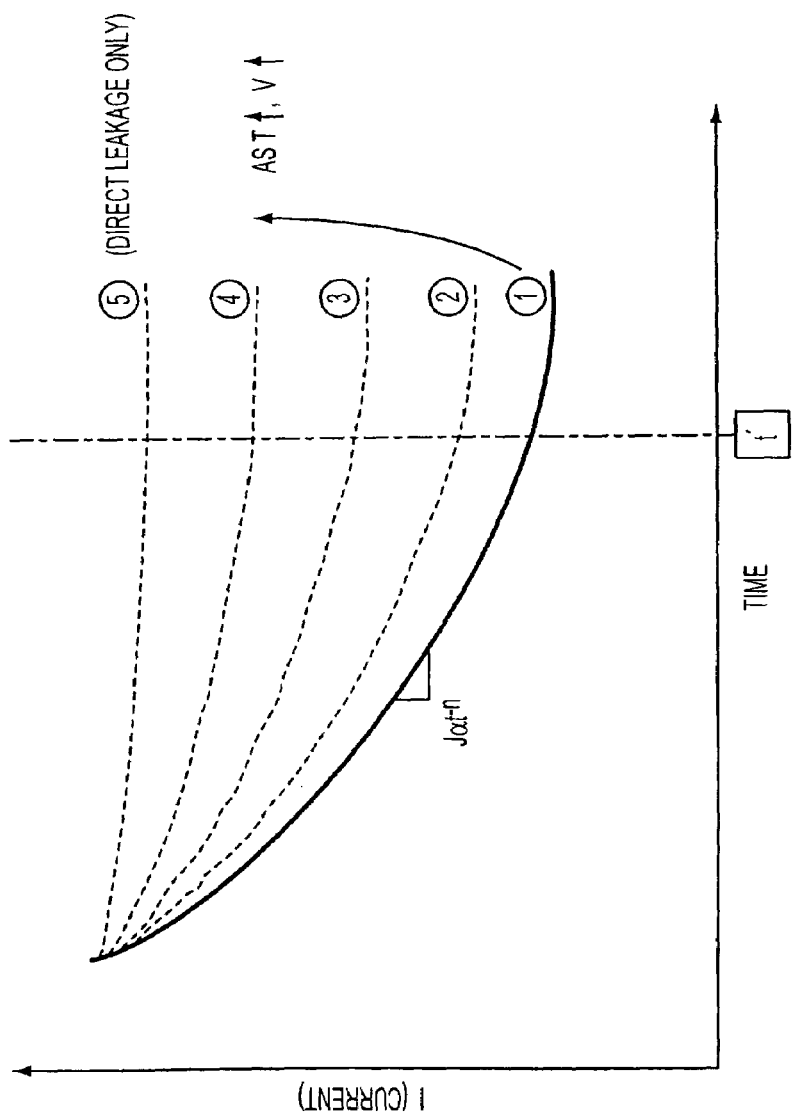
FIG. 2A is a graph of current versus time for a conventional capacitor.
Figure 2B:
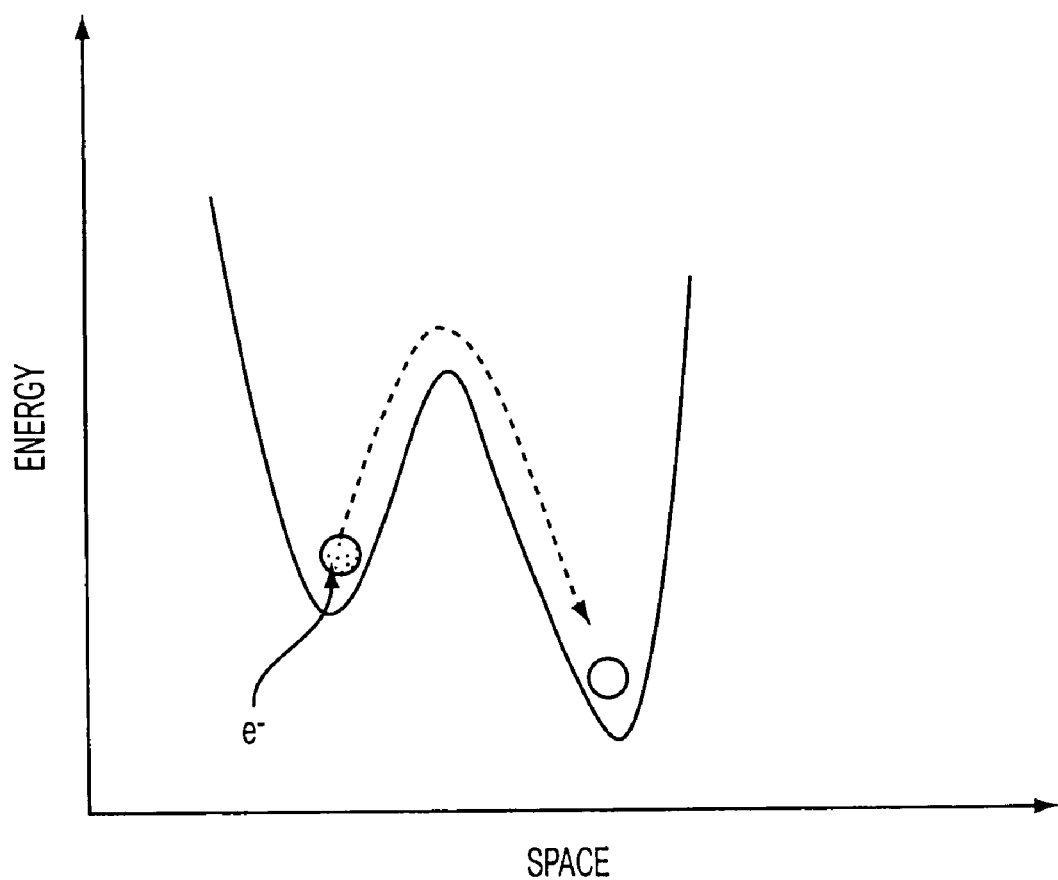
FIG. 2B is a model of a double potential well depicting dielectric relaxation.

FIG. 2B depicts a double potential well, shown as energy versus space, that models the behavior of a charge (e⁻) within a medium when an electric field (from an applied voltage source) is present. When an electric field is applied, the charge (e⁻) will hop from the left well to the right well, thereby changing its energy state. This change in state causes, in turn, a dipole moment creating a current pulse in the medium. Similarly, when the electric field is removed, the charge (e⁻) will eventually move back to its starting point in the left well. This produces a depolarization current having the same magnitude but opposite direction as that just discussed. The present invention utilizes the effect of the double well scenario by controlling the energy states of charges that are found in a dielectric material such that dielectric relaxation is not a problem but instead a tool for sensing the logical state of a memory device. Specifically, additional potential wells are created by applying an increased voltage into a dielectric having a higher k-material doped region. The additional wells contribute to the relaxation currents experienced in the dielectric medium, which is then sensed as a change in logical state.

Figure 2C:
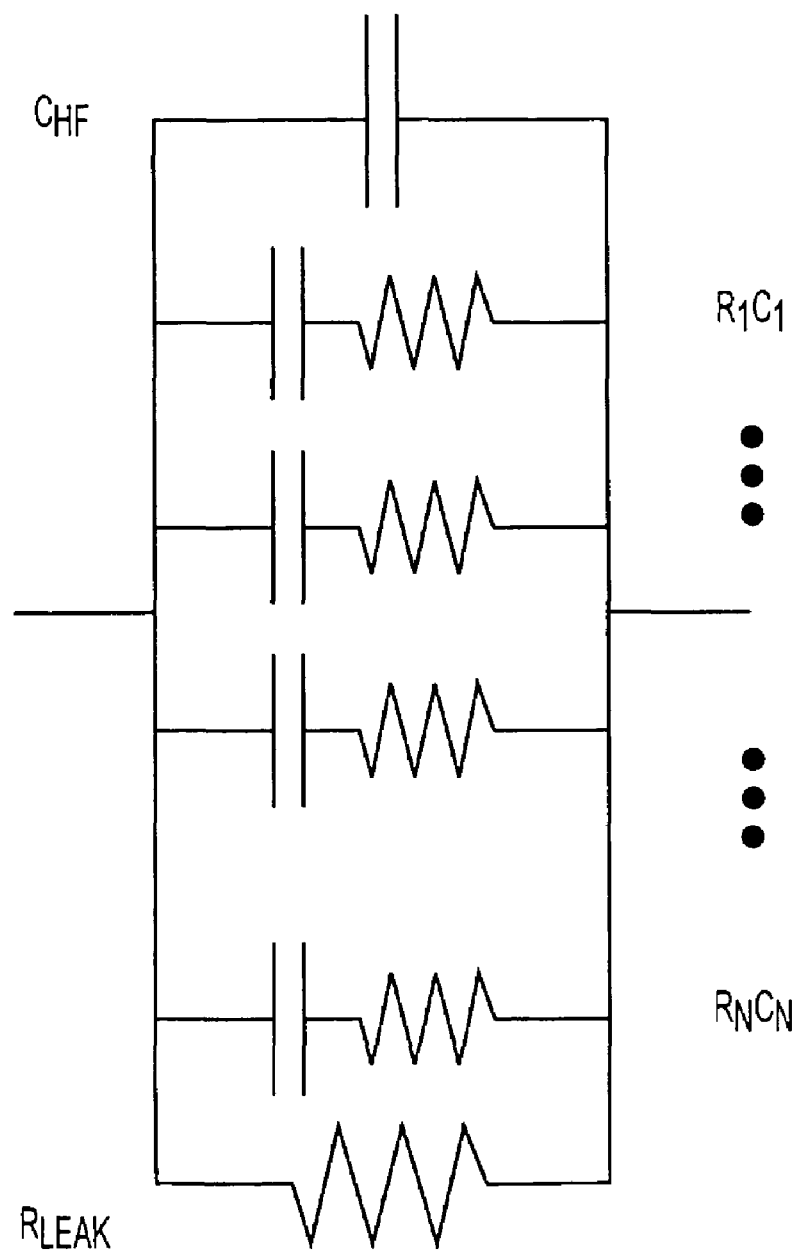
FIG. 2C is an equivalence circuit depicting dielectric relaxation.

FIG. 2C shows a circuit that depicts the current losses attributable to the dielectric relaxation phenomenon, as described in "A Comparative Study of Dielectric Relaxation Losses in Alternative Dielectrics," Reisinger et al., IEEE (2000). As shown in the figure, an ideal capacitor circuit without suffering dielectric relaxation, has a capacitor with capacitance $C_{HF}$ and a resistor with resistance $R_{leak}$. When dielectric relaxation is considered, a series of RC shunts ($R_1C_1 \ldots R_NC_N$) are created, each with a respective time constant of current decay. In the present invention, and as described in more detail below, high-k dielectric regions (e.g., 104 in FIG. 3A) are formed in a capacitor region. These regions create additional energy state wells (See FIG. 2B) and will be components of the RC circuit model shown in FIG. 2C. Thus, for a capacitor (e.g., 100 in FIG. 3A), the time dependence of the decaying currents will change when the additional energy wells are filled, which in turn, provides a change in current reading, thereby creating a memory effect.

Figure 3A:
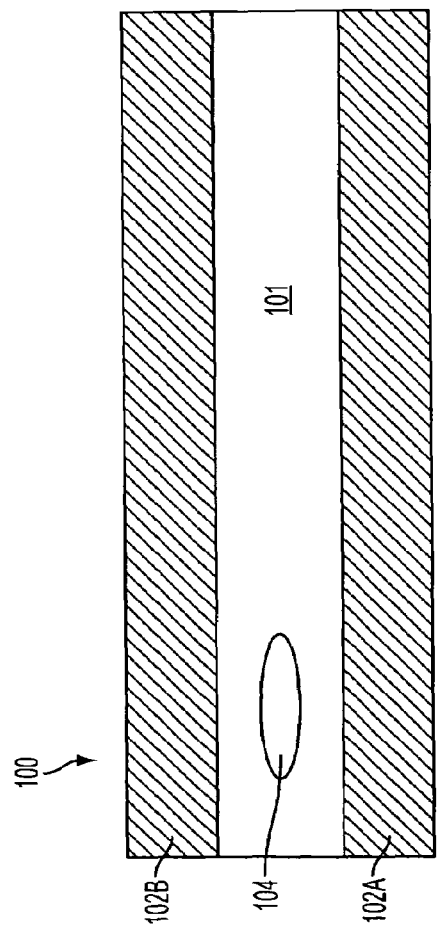
FIG. 3A is a cross sectional view of a portion of a capacitor formed in accordance with a first exemplary embodiment of the present invention.
Figure 3B:
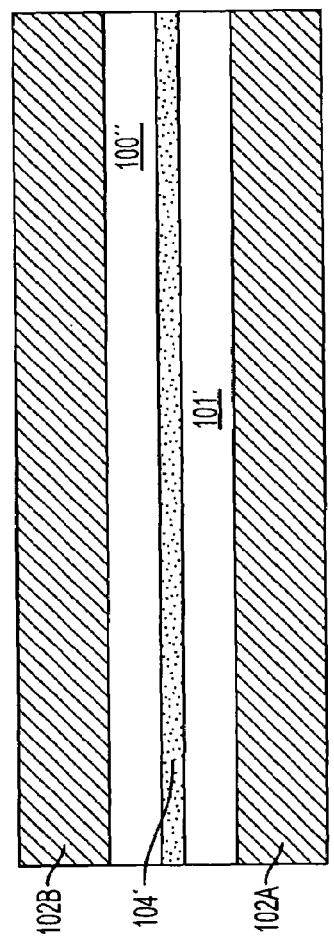
FIG. 3B is a cross sectional view of a portion of a capacitor formed in accordance with a second exemplary embodiment of the present invention.

Capacitors 100, 100' formed in accordance with exemplary embodiments of the present invention are shown in cross-sectional view in FIGS. 3A and 3B. It should be understood that the portions shown are illustrative of an embodiment of the invention, and that the invention encompasses other devices that can be formed using different materials and processes than those described herein. Further, although reference is made to capacitor 100 being utilized in a DRAM memory circuit, the invention is similarly applicable to other types of memory devices that utilize capacitors as storage elements, and the invention is not limited to DRAM memory devices.

In accordance with a first exemplary embodiment of the invention, with reference to FIG. 3A, a layer of conductive material is formed, which serves as a bottom electrode 102A. The electrode 102A may be formed of any electrically conductive material, including, but not limited to, doped polysilicon and titanium nitride. Other possible materials for the electrodes 102A, 102B are Pt, Pd, Rh, Pt—Rh, Ru, TuOx, Ir, IrOx, and TaN.

Next, a layer 101 of dielectric material is formed over the bottom electrode 102A. The dielectric material for layer 101 may be, e.g., aluminum oxide, titanium oxide, hafnium oxide, zirconium oxide, or a nitride. Next, a top electrode layer 102B is formed above the dielectric layer 101, and may be formed of any conductive material. Trap sites 104 are then introduced into the dielectric layer 101. This introduction is preferably done by an atomic layer deposition at interstitial sites in the dielectric layer 101. For example, if the dielectric layer 101 is aluminum oxide, it may be doped at pre-determined positions with hafnium, tantalum oxide or hafnium oxide to form charge trap sites 104 within the dielectric matrix 101. High-k materials such as $(Ba)TiO_3$, $Sr TiO_3$, $Pb TiO_3$, and $PbO_3$ make good trap sites 104, as these materials are known to have significant dielectric relaxation. Potential dopants for creating the trap sites 104 include Hf, Ta, Zr, and Al, which eventually form oxides creating the trap sites 104.

FIG. 3B shows a second exemplary embodiment of a capacitor 100' constructed in accordance with the invention. The only difference between the first and second exemplary embodiments is the location of the trap sites 104 (FIG. 3A), 104'. In the second exemplary embodiment, the trap site 104' is a layer of material sandwiched within the dielectric layer 101'. Specifically, during formation, a thin dielectric layer 101" is formed on the bottom electrode 102A. Next, a thin layer 104' of doping material, such as hafnium oxide or tantalum oxide, or some other high-k dielectric material is formed on the thin dielectric layer 101'. Next, a second thin dielectric layer 101" is formed over the trap site layer 104'.

It should be understood that these two embodiments are only exemplary, and that other capacitor structures, like capacitors 100, 100' are within the scope of the invention, and that trap sites 104, 104' may be formed as desired. The remaining disclosure applies equally to each exemplary embodiment, and is made with reference to capacitor 100 solely for simplicity purposes.

Figure 1:
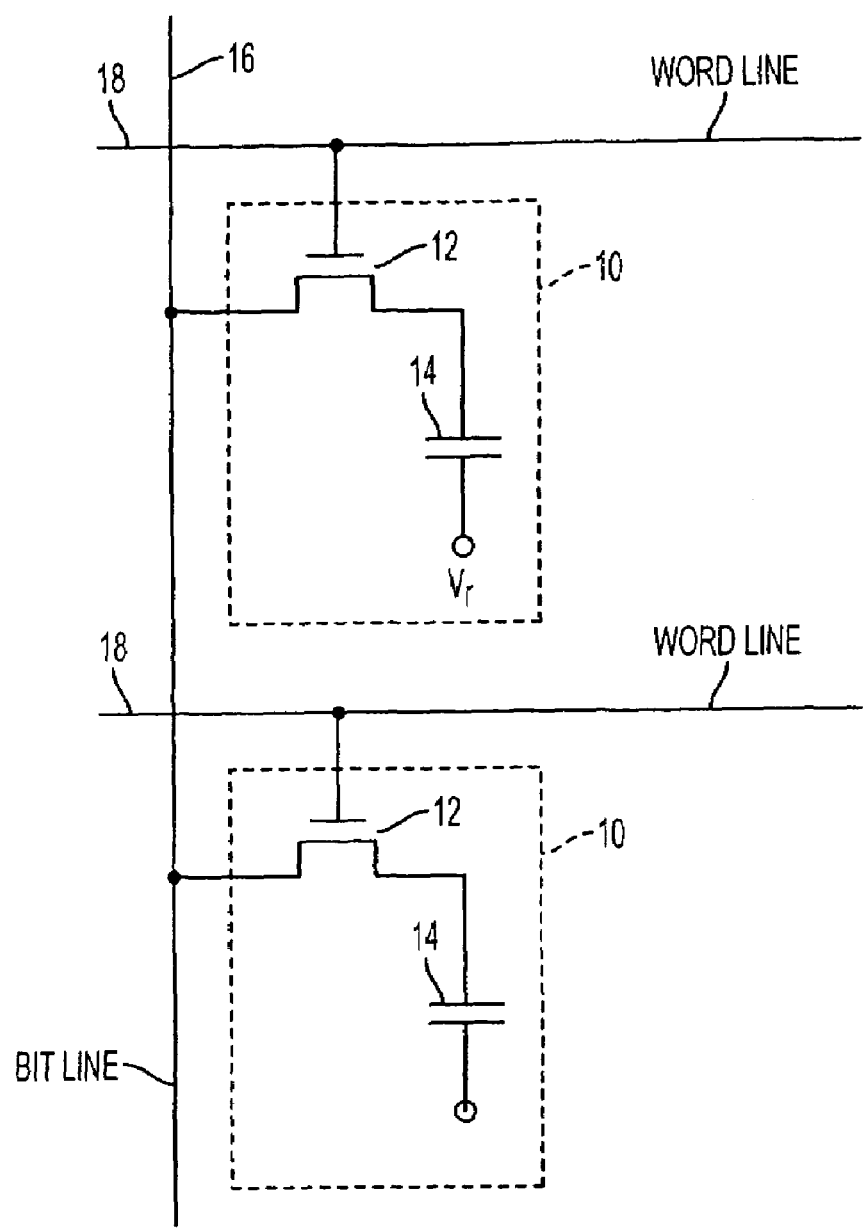
FIG. 1 is a circuit diagram of a portion of a conventional DRAM memory circuit.
Figure 6:
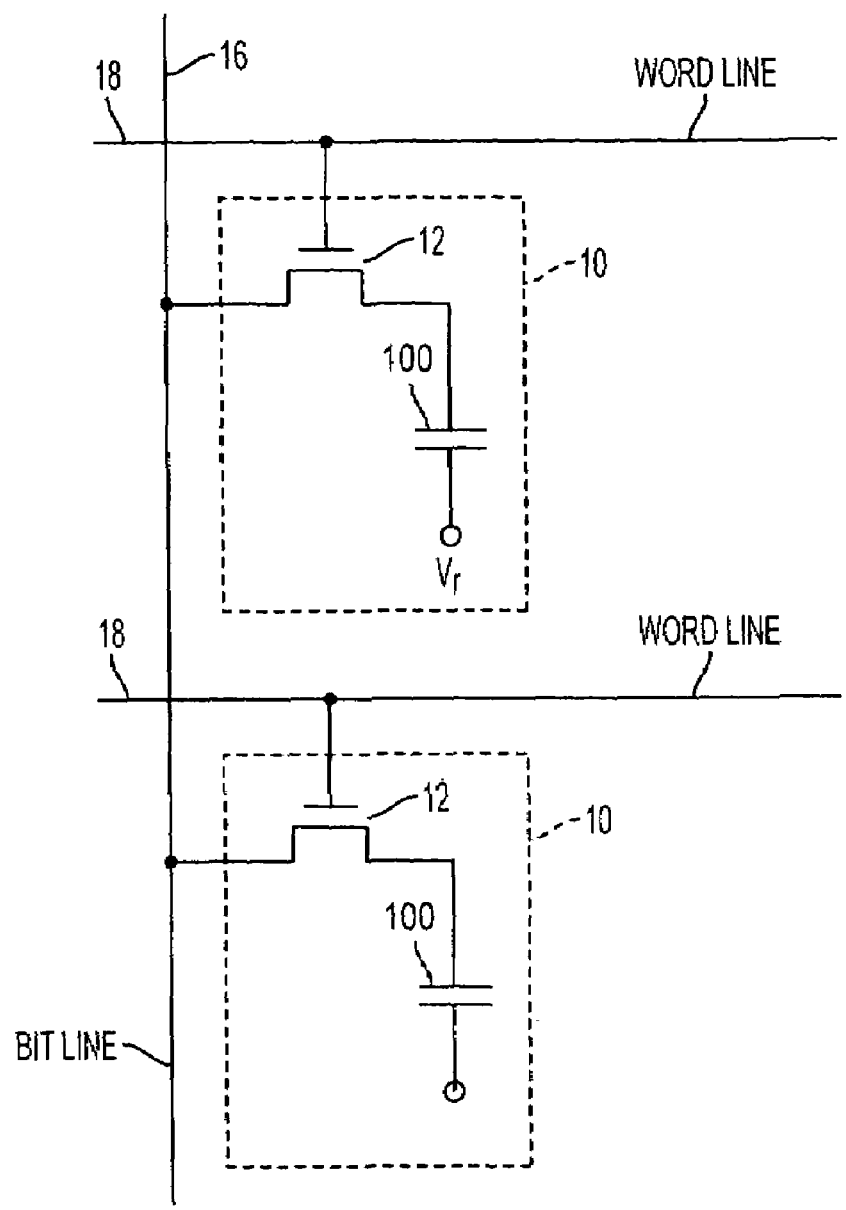
FIG. 6 is a circuit diagram of a portion of a DRAM memory circuit employing an exemplary capacitor in accordance with the present invention.

It is within the scope of the invention that the capacitor 100 may be formed in any known configuration, such as a trench capacitor, a vertical capacitor, a container capacitor, or other capacitor configurations. It should be also be understood that the capacitor 100 may be implemented in a memory device, such as in memory cell 10 as shown in FIG. 1. For exemplary purposes only, operation of the capacitor 100 is now described with reference to the memory cell 10 of FIG. 6, replacing the conventional capacitor 14 with the exemplary capacitor 100. As described above with reference to FIG. 1, to write data into the capacitor 100, a voltage from bit line 16 must travel through an access device, such as access transistor 12 to the capacitor 100. Similarly, to readout a charge from the capacitor 100, an appropriate signal is applied from the word line 18 to activate the access transistor 12 such that a charge from the capacitor 100 may be read out to the bit line 16.

Figure 4:
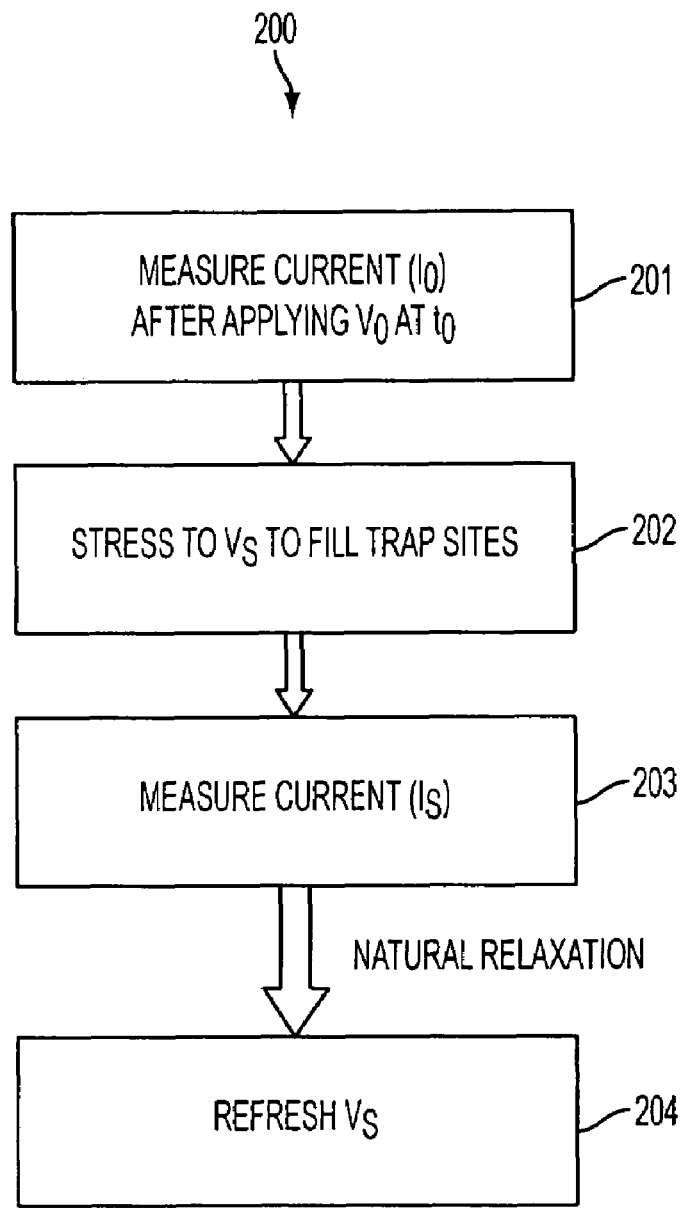
FIG. 4 is a diagram of a sequence of steps for operating a memory device employing an exemplary capacitor in accordance with the present invention.

With reference to FIGS. 4 and 2A, an exemplary method 200 of operating the capacitor 100 as a memory device is now described. At a time $t_0$, an initial voltage $V_0$ is applied to the capacitor 100, $t_0$ represents the time at which this initial event in the method occurs. Using an appropriate read voltage, a current $I_0$ is read out from the capacitor 100 at step 201, at a time t' (FIG. 2A). $I_0$ corresponds to the current output during readout at time t', and in this instance, corresponds to a logical "0" value. t' is a predetermined time after the application of the initial voltage for performing this read cycle, which is selected based on optimizing the output current signal. With reference to FIG. 2A, the current $I_0$ will be different for each of the sloped lines, but represents the value of the y-axis on the graph at time t'. As an alternative to reading out the current at a given time (i.e., $I_0$), the total accumulated charge can be readout from the capacitor 100. In this instance, the readout is an amplified signal, which is graphically represented as the area under the curve, for each curve at time t'.

Next, at step 202, a write voltage $V_S$, larger than the initial voltage $V_0$, is applied to the capacitor dielectric 101 through one of the electrodes 102A. This higher voltage should cause some or all of the trap sites 104 to fill with charge. With reference to FIG. 2B, this corresponds to the charges "hopping" into a second energy well, and with reference to FIG. 2A, this effect in turn causes the capacitor discharge to follow a different sloped discharge profile line. As should be understood, following a different line will make the next current readout, assuming it occurs at time t', to be different than the initial current readout. Therefore, the write voltage $V_S$ must be large enough to change the memory state of the cell. After the pulsed higher voltage $V_S$ is removed, the bias on the dielectric 101 is then returned to zero voltage. Subsequently, a second current readout is taken, at step 203, by applying an associated read voltage. Again, this may be a readout of the current I at time t', or it can be the total accumulated charge.

The second current, $I_S$, should be different than the pre-stress current $I_0$ depending on the trapped charge, meaning the amount of charges in higher energy states. Accordingly, for any given bias condition, the field across the dielectric 101 will be lower or higher depending on the amount of trapped charge. This difference will determine the logical "1" state. Depending on the density and energy state of the trap sites 104, the trapped charge will dissipate during discharge, or return to its original condition, within a given time (e.g., 1 second). Thus, the capacitor 100 needs to be refreshed, at step 204, with application of $V_S$ to the dielectric 101 in order to restore the logical "1" state. The capacitor 100 of the current invention may be tailored to hold a logical "1" state for as long as a flash memory or as short as a DRAM cell.

The amount of applied voltage that is necessary to charge the trap sites 104 at step 202 depends on the energy level of the trap site 104 (which is the barrier height of the second well in FIG. 2B), which is, in turn, dependent on the materials used to form the sites 104 and the dielectric layer 101. Thus, an appropriate level for a write voltage $V_s$ should be chosen based on the materials of the capacitor 100 and the temperature during operation (which is also known to affect the relaxation).

Figure 5:
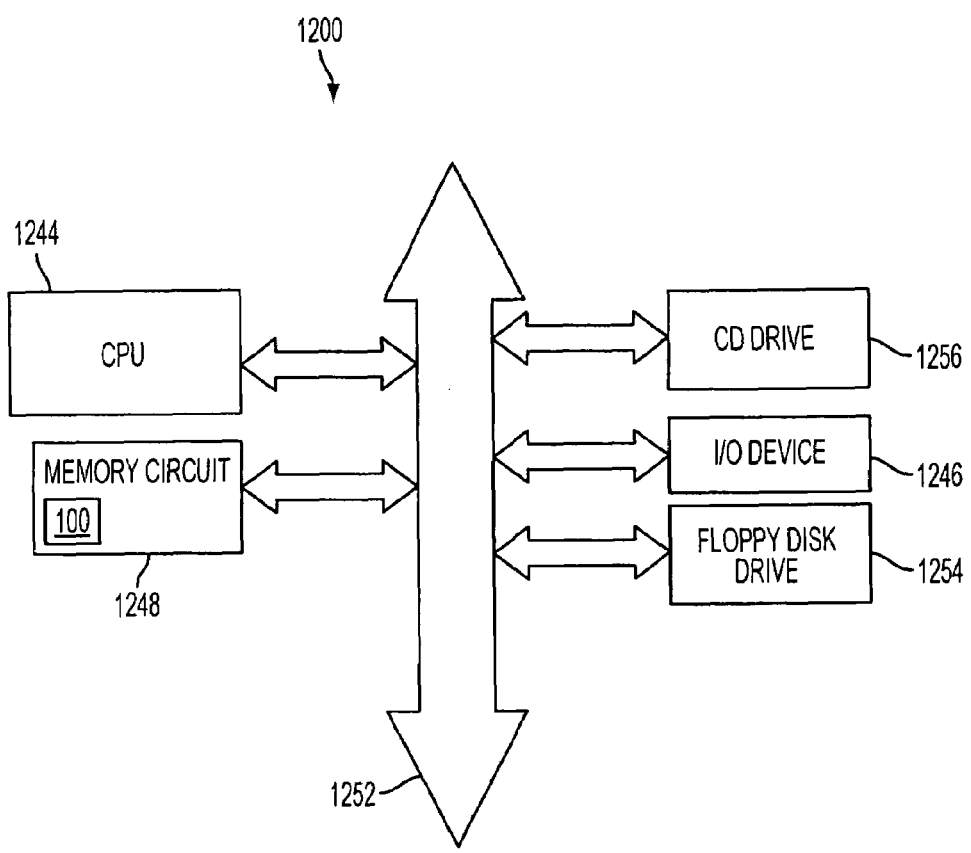
FIG. 5 illustrates a block diagram of a computer system having a memory element in accordance with the invention.

FIG. 5 is a block diagram of a processor system 1200, which includes a memory circuit 1248, for example a DRAM circuit employing a capacitor 100 constructed in accordance with the invention. The processor system 1200, such as a computer system, generally comprises a central processing unit (CPU) 1244, such as a microprocessor, a digital signal processor, or other programmable digital logic devices, which communicates with an input/output (I/O) device 1246 over a bus 1252. The memory 1248 communicates with the system components over bus 1252 typically through a memory controller.

In the case of a computer system, the system 1200 may include peripheral devices such as a floppy disk drive 1254 and a compact disc (CD) ROM drive 1256, which also communicate with CPU 1244 over the bus 1252. Memory 1248 is preferably constructed as an integrated circuit, which includes one or more of the inventive capacitors 100. If desired, the memory 1248 may be combined with the processor, for example CPU 1244, in a single integrated circuit.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A memory device comprising:
   a plurality of memory cells each including a capacitive structure having
   a first electrode,
   a dielectric layer comprising a first material formed over the first electrode, wherein the dielectric layer has at least one type of charge trap sites formed within the dielectric layer, the at least one type of charge trap sites increasing the dielectric relaxation current in the capacitive structure when a predetermined write voltage is applied to fill the at least one type of charge trap sites with charge,
   a second electrode formed over the dielectric layer, and
   an access device for selectively applying the predetermined write voltage to the capacitive structure and for selectively reading out a time-decaying amount of the dielectric relaxation current from the capacitive structure at a predetermined time after the predetermined write voltage is applied,
   whereby, when the at least one type of charge trap sites are filled, the capacitive structure generates the time-decaying amount of dielectric relaxation current at the predetermined time, and whereby the time decaying amount of dielectric relaxation current represents a logic state of data stored by said capacitor; and
   a circuit for controlling a reading out the dielectric relaxation current from the capacitive structures of the memory cells at the predetermined time.

2. The memory device of claim 1, wherein the electrode comprises one of doped polysilicon and titanium nitride.

3. The memory device of claim 1, wherein the first material of the dielectric layer comprises at least one of aluminum oxide, titanium oxide, hafnium oxide, zirconium oxide, silicon dioxide and nitride.

4. The memory device of claim 3, wherein the dielectric layer further comprises a second material including hafnium oxide or tantalum oxide.

5. The memory device of claim 1, wherein the dielectric layer has only one type of charge trap sites.

6. The memory device of claim 1, wherein the dielectric layer has a plurality of types of charge trap sites.

7. The memory device of claim 1, wherein the dielectric layer comprises first and second dielectric layers and has a trap site layer that is located between the first and second dielectric layers.

8. The memory device of claim 1, wherein the memory device is a dynamic access memory device (DRAM).

9. The memory device of claim 1, wherein the selectively applied voltage is a first voltage that induces a first logic state of the capacitive structure by charging the at least one type of charge trap sites.

10. The memory device of claim 9, wherein the access device is configured to selectively apply a second voltage insufficient to charge the at least one type of charge trap sites charged by the first voltage, and the second voltage induces a second logic state different than the first logic state.

11. The memory device of claim 1, wherein the predetermined time is based on a dielectric constant of the dielectric layer.

12. The memory device of claim 11, wherein the predetermined time is further based on the predetermined write voltage.

13. A processor system comprising:
a processing unit for digital logic processing;
a memory device having a plurality of memory cells each comprising
an access device connected at a first side to a bit line and at a gate to a word line,
a capacitor connected to a second side of the access device, wherein the capacitor comprises a dielectric layer formed between electrode layers and having at least one type of charge trap sites located within the dielectric layer, the charge trap sites increasing the dielectric relaxation current in the capacitor when a predetermined write voltage is applied to fill at least one type of charge trap sites with charge, and
the access device for selectively applying the predetermined write voltage to the capacitive structure and for selectively reading out a time-decaying amount of the dielectric relaxation current from the capacitive structure at a predetermined time after the predetermined write voltage is applied,
whereby, when the at least one type of charge trap sites are filled, the capacitive structure generates the time-decaying amount of dielectric relaxation current at the predetermined time, and whereby the time decaying amount of dielectric relaxation current represents a logic state of data stored by said capacitor;
a memory controller for controlling communication of the data stored by the plurality of memory cells between the processing unit and the memory device; and
a controller circuit for controlling a reading out the dielectric relaxation current from the capacitors of the memory cells at the predetermined time.

14. The processor system of claim 13, wherein the access device is an access transistor.

15. The processor system of claim 14, wherein the first side is a source of the access transistor and the second side is a drain of the access transistor.

16. The processor system of claim 13, wherein the dielectric layer comprises one of an oxide of aluminum, titanium, hafnium, and zirconium and a nitride.

17. The processor system of claim 13, wherein the charge trap sites comprise one of hafnium oxide and tantalum oxide.

18. The processor system of claim 13, wherein the memory device is a dynamic access memory device (DRAM).

19. The processor system of claim 13, wherein the selectively applied voltage is a first voltage that induces a first logic state of the capacitor by charging the charge trap sites.

20. The processor system of claim 19, wherein the access device is configured to selectively apply a second voltage insufficient to charge the charge trap sites charged by the first voltage, and the second voltage induces a second logic state different than the first logic state.

21. The processor system of claim 13, wherein the memory device is constructed as an integrated circuit.

22. The processor system of claim 21, wherein the memory device is combined with the processing device to form at least part of a single integrated circuit.

23. The processor system of claim 13, wherein the predetermined time is based on a dielectric constant of the dielectric layer.

24. The memory device of claim 23, wherein the predetermined time is further based on the predetermined write voltage.

25. A memory device comprising:
a plurality of memory cells each having a capacitive structure comprising
a first electrode,
a second electrode,
a dielectric material comprising at least one type of charge trap sites and configured to discharge a first time-decaying amount of dielectric relaxation current when the at least one type of charge trap sites are empty and a second time-decaying amount of dielectric relaxation current when the at least one type of charge trap sites are filled, and
an access device for selectively applying one of a predetermined first and second write voltage to the capacitive structure and for selectively reading out the time-decaying amount of dielectric relaxation current from the capacitive structure at a predetermined time after the one predetermined write voltage is applied,
wherein the dielectric material is configured to discharge, at the predetermined time, the first amount of dielectric relaxation current if said first write voltage was applied and the second amount of dielectric relaxation current if said second write voltage was applied, and wherein the first and second amounts of dielectric relaxation current respectively indicate different first and second logic states of data stored by the capacitive structure; and
a circuit for controlling reading out of the dielectric relaxation current from the plurality of memory cells at the predetermined time.

26. The memory device of claim 25, wherein the dielectric material comprises at least one type of charge trap sites configured to fill with charge when said one of the first and second write voltages is applied.

* * * * *

UNITED STATES PATENT AND TRADEMARK OFFICE
CERTIFICATE OF CORRECTION

PATENT NO. : 7,388,248 B2 Page 1 of 1
APPLICATION NO. : 10/930774
DATED : June 17, 2008
INVENTOR(S) : Basceri et al.

It is certified that error appears in the above-identified patent and that said Letters Patent is hereby corrected as shown below:

On the Title page, in Item (75), in "Inventors", in column 1, line 1, delete "Boise, ID" and insert -- Reston, VA --, therefor.

On the Title page, in Item (57), under "Abstract", in column 2, line 7, delete "deposition," and insert -- deposition --, therefor.

Signed and Sealed this

Seventh Day of October, 2008

JON W. DUDAS
*Director of the United States Patent and Trademark Office*